United States Patent
Presti

(10) Patent No.: US 12,556,142 B2
(45) Date of Patent: Feb. 17, 2026

(54) RECONFIGURABLE AND TUNABLE POWER AMPLIFIER

(71) Applicant: Renesas Electronics Corporation, Tokyo (JP)

(72) Inventor: Calogero Davide Presti, San Diego, CA (US)

(73) Assignee: Renesas Electronics Corporation, Tokyo (JP)

( * ) Notice: Subject to any disclaimer, the term of this patent is extended or adjusted under 35 U.S.C. 154(b) by 545 days.

(21) Appl. No.: 18/145,977

(22) Filed: Dec. 23, 2022

(65) Prior Publication Data

US 2024/0213925 A1   Jun. 27, 2024

(51) Int. Cl.
*H03F 1/02* (2006.01)
*H03F 1/56* (2006.01)
*H03F 3/21* (2006.01)

(52) U.S. Cl.
CPC ............ *H03F 1/0288* (2013.01); *H03F 1/56* (2013.01); *H03F 3/211* (2013.01); *H03F 2200/387* (2013.01); *H03F 2200/451* (2013.01)

(58) Field of Classification Search
CPC .......... H03F 1/0288; H03F 1/56; H03F 3/211; H03F 2200/387; H03F 2200/451
USPC ........................................................ 330/295
See application file for complete search history.

(56) References Cited

U.S. PATENT DOCUMENTS

| | | | | |
|---|---|---|---|---|
| 7,518,448 B1 * | 4/2009 | Blair | ..................... | H03F 1/0288 330/51 |
| 8,855,584 B2 * | 10/2014 | Harris | .................. | H04B 1/0458 455/107 |
| 9,286,429 B2 * | 3/2016 | Racey | ..................... | G06F 30/36 |
| 9,831,857 B2 * | 11/2017 | Facchini | .............. | H03F 1/0288 |
| 2016/0020733 A1 * | 1/2016 | Kaehs | ..................... | H03F 3/245 330/262 |

FOREIGN PATENT DOCUMENTS

CN      101350599 B  * 11/2010  ............... H03F 3/72

* cited by examiner

*Primary Examiner* — Hafizur Rahman
(74) *Attorney, Agent, or Firm* — SCULLY, SCOTT, MURPHY & PRESSER, P.C.

(57) ABSTRACT

Apparatuses, systems and methods for operating a power amplifier are described. A controller can drive a power amplifier chain with first input bias voltages to operate the power amplifier chain in a first operation mode that implements a Doherty amplifier. The controller can drive the power amplifier chain with second input bias voltages to operate the power amplifier chain in a second operation mode that implements a balanced amplifier. The controller can tune the termination circuit in accordance with an operation mode of the power amplifier chain.

20 Claims, 5 Drawing Sheets

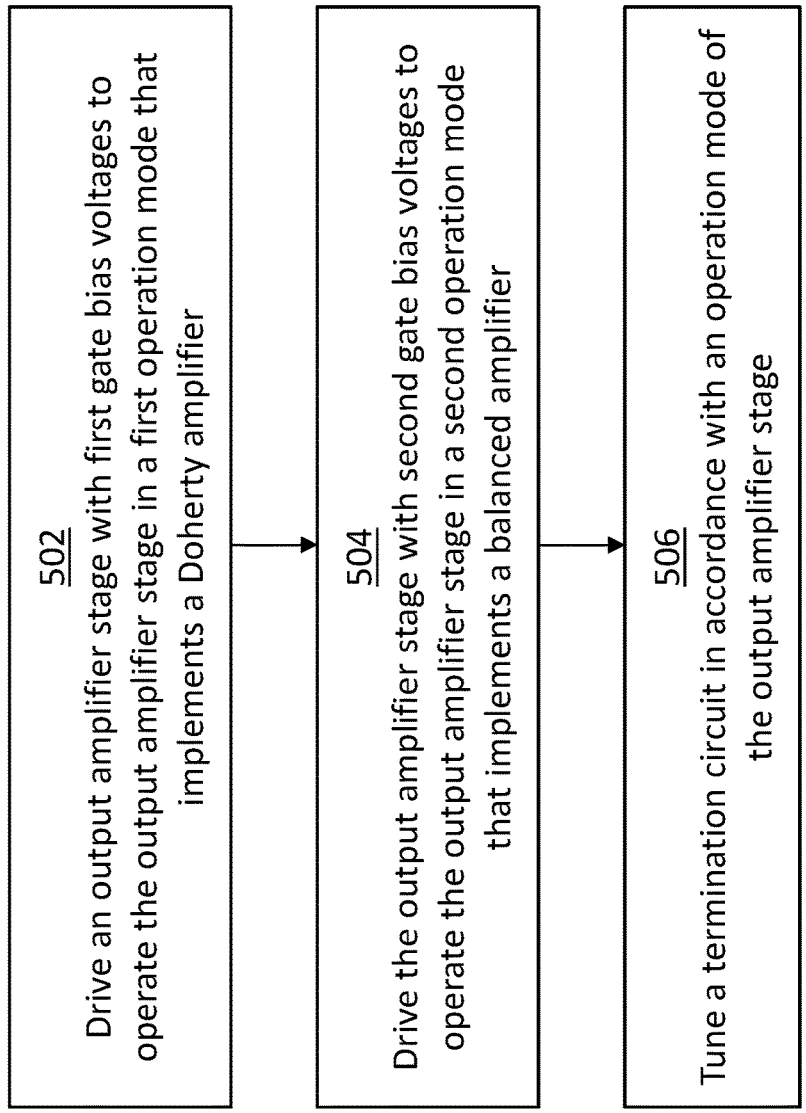

RECONFIGURABLE AND TUNABLE POWER AMPLIFIER

TECHNICAL FIELD

The present disclosure relates in general to apparatuses and systems for wireless power amplification. In particular, the present disclosure relates to a power amplifier that can be configurable for different operation modes with tunable termination.

BACKGROUND

Wireless communication systems may employ power amplifiers for increasing the power of radio frequency (RF) signals. In a wireless communication system, a power amplifier in a final amplification stage of a transmission channel may facilitate amplification of a signal to an antenna for radiation over the air. High gain, high linearity, stability, and a high level of power-added efficiency are characteristics of a desirable amplifier in such a wireless communication system. In general, a power amplifier may operate at maximum power efficiency when the power amplifier transmits close to saturated power. However, power efficiency may degrade as output power decreases. Therefore, a high efficiency power amplifier architecture may be desirable for current and next-generation wireless systems.

SUMMARY

In one embodiment, an apparatus for operating a power amplifier is generally described. The apparatus can include a termination circuit and a controller. The controller can be configured to drive a power amplifier chain with first input bias voltages to operate the power amplifier chain in a first operation mode that implements a Doherty amplifier. The controller can be further configured to drive the power amplifier chain with second input bias voltages to operate the power amplifier chain in a second operation mode that implements a balanced amplifier. The controller can be further configured to tune the termination circuit in accordance with an operation mode of the power amplifier chain.

In one embodiment, an apparatus for operating a power amplifier is generally described. The apparatus can include a splitter configured to receive an input radio frequency (RF) signal and split the input RF signal into a first RF signal and a second RF signal. The apparatus can further include a power amplifier chain configured to receive the first RF signal and the second RF signal from the splitter. The apparatus can further include a combiner configured to combine a first output and a second output of the power amplifier chain to generate an output RF signal. The apparatus can further include a termination circuit. The apparatus can further include a controller configured to drive the power amplifier chain with first input bias voltages to operate the power amplifier chain in a first operation mode that implements a Doherty amplifier. The controller can be further configured to drive the power amplifier chain with second input bias voltages to operate the power amplifier chain in a second operation mode that implements a balanced amplifier. The controller can be further configured to tune the termination circuit, in accordance with an operation mode of the power amplifier chain, to provide adjustable termination to the combiner.

In one embodiment, a method for operating a power amplifier is generally described. The method can include driving a power amplifier chain with first input bias voltages to operate the power amplifier chain in a first operation mode that implements a Doherty amplifier. The method can further include driving the power amplifier chain with second input bias voltages to operate the power amplifier chain in a second operation mode that implements a balanced amplifier. The method can further include tuning a termination circuit in accordance with an operation mode of the power amplifier chain.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

BRIEF DESCRIPTION OF THE DRAWINGS

FIG. 5 is a flowchart of an example process that may implement reconfigurable and tunable power amplifier in one embodiment.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
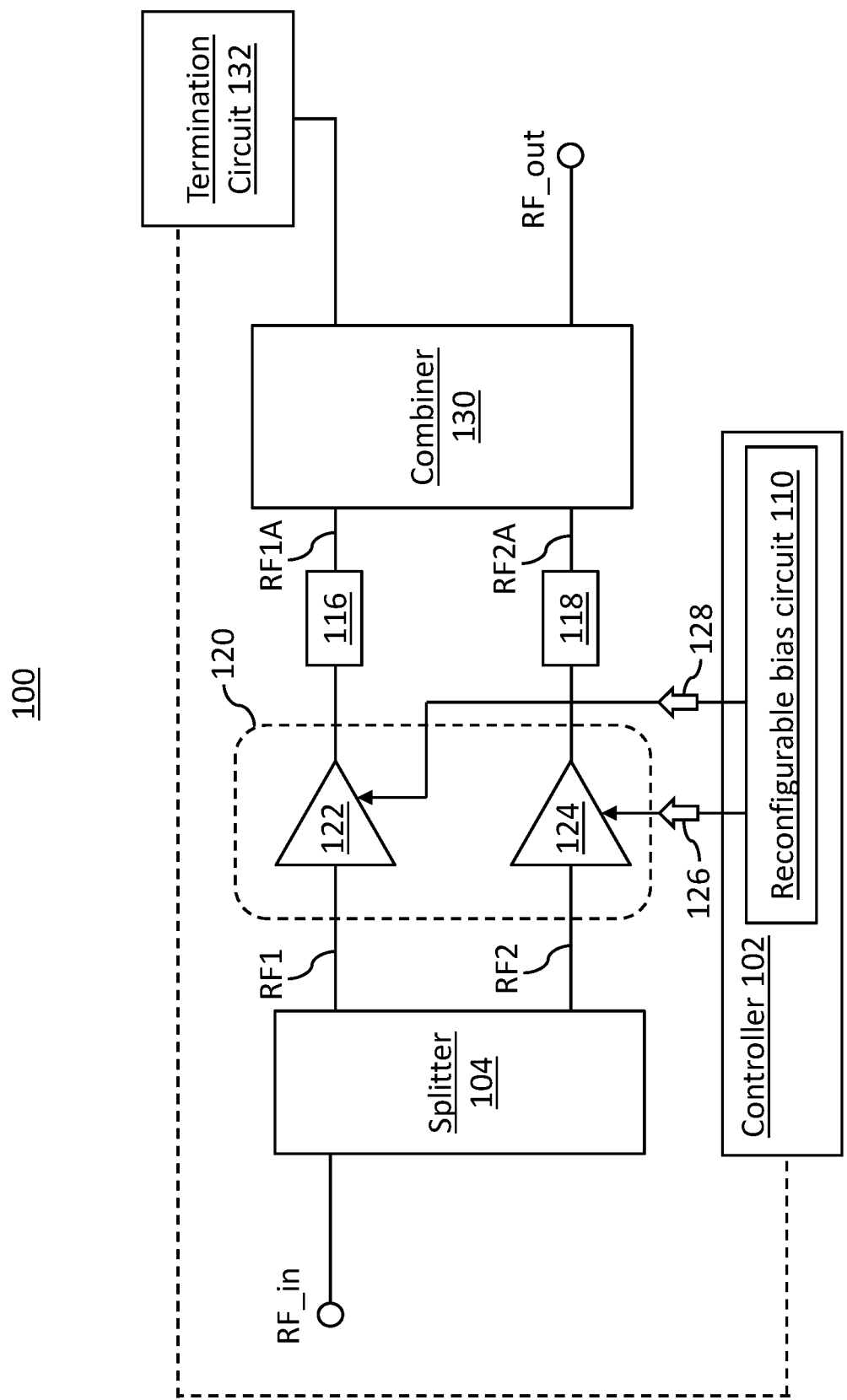
FIG. 1 is a diagram showing an example apparatus that can implement reconfigurable and tunable power amplifier in one embodiment.

FIG. 1 is a diagram showing an example apparatus 100 that can implement reconfigurable and tunable power amplifier in one embodiment. Apparatus 100 can be a power amplifier module with multiple components (e.g., chips, die, circuit elements, etc.) integrated in one semiconductor package. Apparatus 100 can include a controller 102, a splitter 104, a power amplifier chain 120, a combiner 130 and a termination circuit 132. In one embodiment, controller 102 can be a power management integrated circuit (PMIC). Apparatus 100 can be configured to receive an input signal RF_in, and amplify RF_in to produce an output signal RF_out. RF_in and RF_out can be radio frequency signals.

In one embodiment, apparatus 100 can be a power amplifier module integrated in a RF communication device such as a radio transmitter, radio transceiver, a beamformer circuit, and/or other types of RF communication devices that requires RF signal amplification. An output terminal of apparatus 100 can be connected to a load or a device that receives output signal RF_out for further processing, such as routing, filtering, switching, or radiation, or any combination thereof. This load can provide the processed signal to, for example, an antenna or one or more antennas among a phased array.

Input signal RF_in can be received by apparatus 100 and splitter 104 can split RF_in into two RF signals labeled as RF1 and RF2. Splitter 104 can include various passive components (e.g., resistors, inductors, capacitors), transformers or coupled inductors, and distributed components such as transmission lines or coupled transmission lines, that can facilitate splitting of input signal RF_in. In one embodiment, splitter 104 can be implemented by a 90-degree 3-decibel (dB) coupler with a matched termination.

Power amplifier chain 120 can include one or more amplifier stages 122 and one or more amplifier stages 124. Amplifier stages 122, 124 can be formed by various types of transistors, such as metal semiconductor field-effect transistors (MESFET), high-electron-mobility transistors (HEMT), pseudomorphic high-electron-mobility transistors (pHEMT), heterostructure field-effect transistors (HFET), laterally-diffused metal-oxide semiconductor (LDMOS) transistors, Complementary metal-oxide-semiconductor (CMOS) transistors, junction field effect transistors (JFET), bipolar junction transistors (BJT), heterojunction bipolar transistors (HBT), graded base transistors, or other types of transistors. Materials that can be used for the transistors can include, but not limited to, Silicon, Gallium Arsenide (GaAs), Indium Phosphide (InP), Gallium Nitride (GaN), Silicon Germanium (SiGe).

Amplifier stages 122 can include at least one amplification stage and amplifier stages 124 can include at least one amplification stage. In one embodiment, amplifier stages 122, 124 can be symmetric, such as including identical RF amplifiers that have the same power capabilities. RF signal RF1 and RF signal RF2 can be received by amplifier stages 122, 124 of power amplifier chain 120, respectively. Amplifier stages 122 can apply a gain to RF1 to amplify RF1 to produce a RF signal RF1A, where RF1A can be an amplified version of RF1. Amplifier stages 124 can apply a gain to RF2 to amplify RF2 to produce a RF signal RF2A, where RF2A can be an amplified version of RF2.

Combiner 130 can be configured to combine RF signals RF1A and RF2A into output signal RF_out. Combiner 130 can include various passive components (e.g., resistors, inductors, capacitors), transformers or coupled inductors, and distributed components such as transmission lines or coupled transmission lines, that can facilitate combination of RF signals RF1A and RF2A. In one embodiment, combiner 130 can be implemented by a 90-degree 3-decibel (dB) coupler with a matched termination.

In one embodiment, a matching network 116 can be connected between an output of amplifier stages 122, and a matching network 118 can be connected between an output of amplifier stages 124. Matching networks 116, 118 can be configured to perform impedance inversion to match an output impedance of power amplifier chain 120 with an impedance of combiner 130. The impedance matching can maximize power being transferred from power amplifier chain 120 to combiner 130 and/or to prevent generation of standing waves between power amplifier chain 120 and combiner 130.

In one embodiment, controller 102 can be configured to generate input bias voltage 126 to drive amplifier stages 122, and generate a input bias voltage 128 to drive amplifier stages 124. Input bias voltages 126, 128 can be configurable or adjustable, by controller 102, to configure amplifier stages 122, 124 between a peaking mode and a linear mode. When one of amplifier stages 122, 124 operates under peaking mode and the other amplifier operated under linear mode, power amplifier chain 120 operates in a first operation mode to implement a Doherty power amplifier. The amplifier operating under linear mode can be a main amplifier of a Doherty power amplifier, and the amplifier operating under peaking mode can be an auxiliary amplifier of the Doherty power amplifier.

In one embodiment, controller 102 can set input bias voltage 126 to be greater than input bias voltage 128 to configure amplifier stages 122 as the main or linear amplifier and to configure amplifier stages 124 as the auxiliary or peaking amplifier in the first operation mode. In one embodiment, controller 102 can set input bias voltage 126 to be less than input bias voltage 128 to configure amplifier stages 122 as the auxiliary or peaking amplifier and to configure amplifier stages 124 as the main or linear amplifier in the first operation mode. In an aspect, the choice of using amplifier stages 122 or amplifier stages 124 as main amplifier and auxiliary amplifier can be dependent on the phase relationships in combiner 130 and the termination provided by termination circuit 132. In one or more embodiments, reconfigurable bias circuit 110 can be configured to sense RF power being fed to the amplifier stages (e.g., one of amplifier stages 122 or 124) configured as the auxiliary amplifier and, based on the sensed RF power, adjust (e.g., increase) the input bias voltage for the auxiliary amplifier. For example, reconfigurable bias circuit 110 can adjust the input bias voltage for the auxiliary amplifier from a lower value (e.g., no RF applied) to a higher value (e.g., proportional or growing with input signal RF_in) in order for the auxiliary amplifier to reach a desired RF signal at its output, despite starting from a lower bias voltage. When both amplifier stages 122, 124 operate under linear mode, power amplifier chain 120 operates in a second operation mode to implement a balanced power amplifier. In one embodiment, controller 102 can set input bias voltage 126 to be equivalent to input bias voltage 128 to configure amplifier stages 122, 124 as linear amplifiers in the second operation mode.

Further, controller 102 can be configured to tune termination circuit 132. Termination circuit 132 can be tunable to accommodate the operating modes of amplifier stages 122, 124 in power amplifier chain 120. If power amplifier chain 120 is operating under the first operation mode to implement a Doherty power amplifier, termination circuit 132 can be tuned to provide a reflective termination to combiner 130. If power amplifier chain 120 is operating under the second operation mode to implement a balanced power amplifier, termination circuit 132 can be tuned to provide a matched termination (e.g., zero reflection) to combiner 130.

Power amplifier designs can face tradeoffs between contrasting requirements, such as efficiency and linearity. To design relatively efficient power amplifiers, techniques such as Doherty and envelope tracking can be used, but these techniques come with penalties in amplifier linearity. Further, envelope tracking is not viable in some situations, such as millimeter (mm)-wave beamformer systems that have a large number of amplifiers and/or transmits relatively large bandwidth signal (>100 megahertz (MHz)). On the other hand, to design power amplifiers that are more linear (e.g., able to transmit the signal with greater fidelity), balanced power amplifier can be used, especially in cases where the amplifier is loaded by a non-ideal load (e.g., load mismatch).

Apparatus 100 can be configurable to address the tradeoffs between efficiency and linearity. By using controller 102 to provide reconfigurable input bias voltages 126, 128, power amplifier chain 120 can be configured to implement a Doherty power amplifier or a balanced power amplifier depending on whether apparatus 100 needs to be configured to optimize efficiency or to optimize linearity. If there is a need to optimize efficiency, controller 102 can set voltage levels of input bias voltages 126, 128 that configure one of amplifier stages 122, 124 to operate in peaking amplifier and the other amplifier to operate in linear mode. If there is a need to optimize linearity, controller 102 can set voltage levels of input bias voltages 126, 128 that configure both amplifier stages 122, 124 to operate in linear mode. Controller 102 can also tune termination circuit 132 based on whether power amplifier chain 120 is being implemented as Doherty power amplifier or balanced power amplifier.

During development cycles of power amplifiers, performance requirements can change due to market shifts or changes in application hardware. Thus, power amplifiers that are designed based on the architecture of apparatus 100 can be configured to address changes in performance requirements during development cycles. Further, different systems that utilizes amplifiers can operate under different requirements, power amplifiers that are designed based on the architecture of apparatus 100 can be configured to accommodate different systems having different requirements without software and/or hardware changes. Furthermore, operating conditions of a system utilizing a power amplifier can impact a performance of the amplifier. For example, in a millimeter (mm)-wave beamformer chip, the amplifier loading is closer to ideal when the beam is broadside (thus allowing for efficiency enhancement), but the power amplifier within the same system can experience a load mismatch when the beam is tuned at larger scanning angle (unsuitable for efficiency enhancement). Therefore, power amplifiers that are designed based on the architecture of apparatus 100 can be configured to function under different operating conditions without hardware modifications. Still further, Doherty power amplifiers can achieve optimal efficiency under a narrow set of frequencies. Since the Doherty design conditions depend on values of impedances or electrical lengths of passive circuits, which change over frequency, power amplifiers that are designed based on the architecture of apparatus 100 can be tuned to attain the optimal Doherty operations across a wider range of frequencies.

Figure 2:
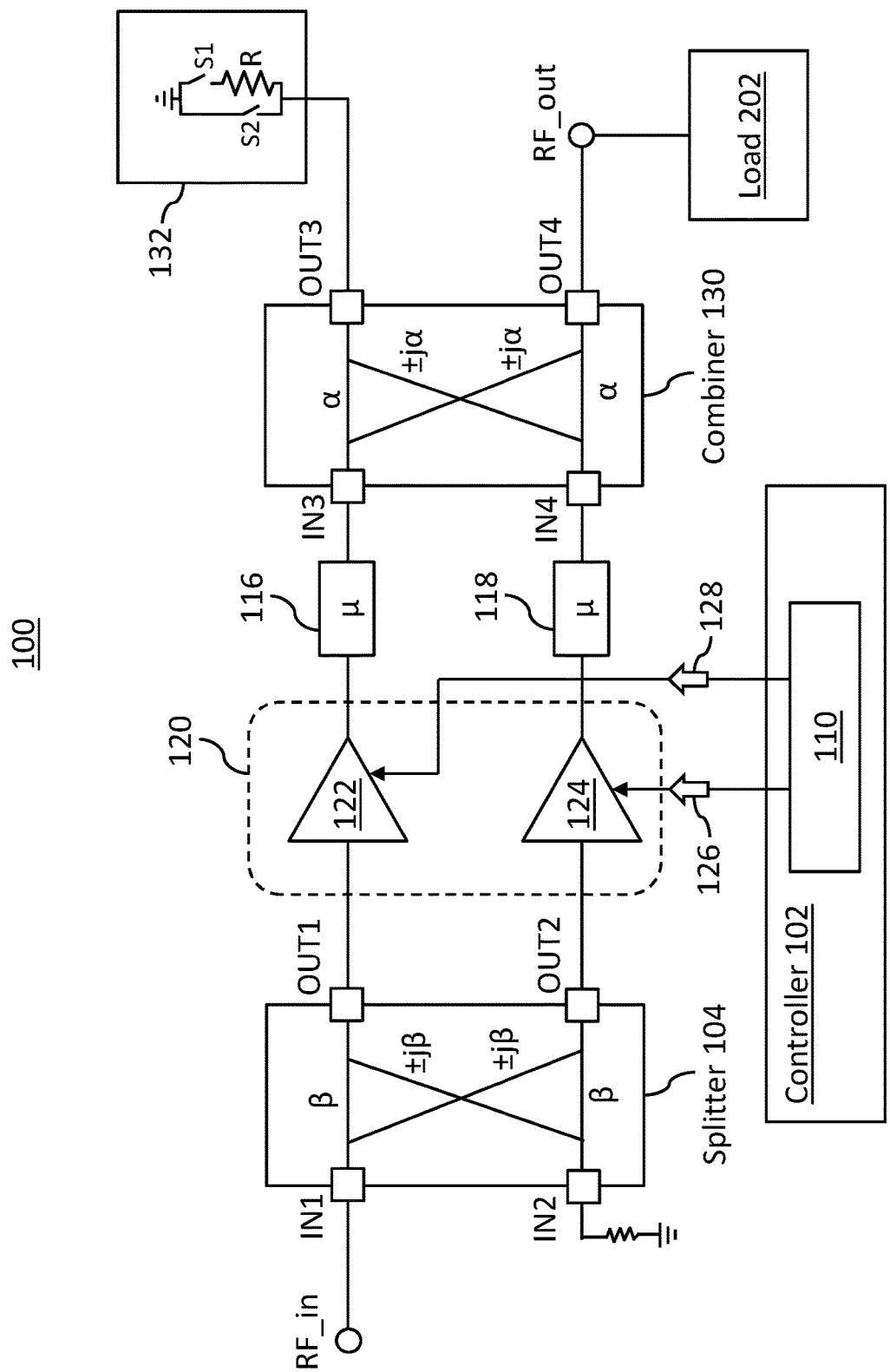
FIG. 2 is a diagram showing additional details of the example apparatus shown in FIG. 1 in one embodiment.

FIG. 2 is a diagram showing additional details of the example apparatus shown in FIG. 1 in one embodiment. In an embodiment shown in FIG. 2, splitter 104 can be a 90-degree 3-decibel (dB) coupler with a matched termination. Splitter 104 can include four ports—two input ports labeled as IN1, IN2 and two output ports labeled as OUT1, OUT2. Input port IN1 can be connected to RF_in, output port OUT1 can be connected to an input of amplifier stages 122, and output port OUT2 can be connected to an input of amplifier stages 124. Input port IN2 can be shorted to ground. Coupling factor between ports IN1 and OUT1, and between IN2 and OUT2, can be denoted as β, where β can be a complex number. Coupling factor between ports IN1 and OUT2, and between IN2 and OUT1, can be denoted as ±jB, where ±j represents a phase shift of approximately 90-degrees. By using a 90-degree 3-dB coupler with a matched termination to implement splitter 104, input of splitter 104 can be impedance matched regardless of the input impedance of amplifier stages 122 and/or amplifier stages 124, and proper phase shift among amplifier stages 122, 124 can be provided.

Combiner 130 can be a 90-degree 3-dB coupler with a tunable termination. Combiner 130 can include four ports— two input ports labeled as IN3, IN4 and two output ports labeled as OUT5, OUT6. Input port IN3 can be connected to an output of amplifier stages 122 via matching network 116, input port IN4 can be connected to an output of amplifier stages 124 via matching network 118, output port OUT3 can be connected to termination circuit 132, and output port OUT4 can be connected to RF_out. Coupling factor between ports IN3 and OUT3, and between IN4 and OUT4, can be denoted as a, where a can be a complex number. Coupling factor between ports IN3 and OUT4, and between IN4 and OUT3, can be denoted as ±jα, where ±j represents a phase shift of approximately 90-degrees. In one embodiment, a load 202 (e.g., an antenna, or load that apparatus 100 is driving) can be connected to output port OUT4 such that power can be delivered from apparatus 100 to load 202 via RF_out.

When power amplifier chain 120 operates in the first operation mode to implement a Doherty power amplifier, one of amplifier stages 122, 124 can be configured as the main or linear amplifier, and the other amplifier can be configured as the auxiliary or peaking amplifier. The peaking amplifier needs to stay off up to the backoff power and then ramp up to the same current magnitude as the linear amplifier. The peaking amplifier can be driven to produce a current that is Fj shifted relative to the linear amplifier. Reconfigurable bias circuit 110 can set input bias voltages 126, 128 to different levels at different times to achieve these features associated with power amplifier chain 120 operating as Doherty power amplifier.

When power amplifier chain 120 operates in the second operation mode to implement a balanced power amplifier, both amplifier stages 122, 124 are configured as linear amplifiers. One of amplifier stages 122, 124 can be driven to produce a current that is Fj shifted relative to the other amplifier. Reconfigurable bias circuit 110 can set input bias voltages 126, 128 to different levels at different times to achieve these features associated with power amplifier chain 120 operating as balanced power amplifier.

In an aspect, the phase shift between the signal at the input of amplifier stages 122, 124 can be set to counteract the phase shift of combiner 130. By way of example, depending on the actual sign of ±jα in combiner 130, and depending on which amplifier stages (e.g., amplifier stages 122 or 124) is set to be the peaking amplifier, if the peaking amplifier transmission to load 202 is leading (or lagging) the main amplifier by 90-degrees, then the peaking amplifier can be driven to produce a current that is minus (or plus) 90-degrees shifted relative to the linear amplifier, respectively.

Also, when power amplifier chain 120 operates in the first operation mode to implement a Doherty power amplifier, the port connected to the main or linear amplifier (e.g., OUT3 or OUT 4) is terminated with load 202, and the output impedance is zero (e.g., zero reflection from load 202). The port connected to the auxiliary or peaking amplifier needs to be terminated with an impedance that meets the condition:

$$\Gamma_r = -\frac{1}{2\alpha^2}$$

where $\Gamma_r$ denotes the reflection coefficient from the termination and a represents a transmission from a main amplifier of a Doherty power amplifier to load 202. Further, a desired value of $\Gamma_r$ can be dependent on a product μα that represents a transmission from a main amplifier of a Doherty power amplifier to load 202, where μ denotes a phase shift of the impedance matching network (e.g., matching networks 116, 118)

between the amplifier (e.g., amplifier stages 122, 124) and combiner 130. If the product μα is a real number, then $\Gamma_r$ shall be set to −1. If the product μα is an imaginary number, then $\Gamma_r$ shall be set to 1. In cases where the product μα is neither real nor imaginary, but a generic complex number, then the termination can be set as the relationship $$\Gamma_r = -\frac{1}{2(\mu\alpha)^2}.$$

Termination circuit 132 can be tuned by controller 102 to provide the reflection $\Gamma_r$ for different situations, such as a first configuration where amplifier stages 122 is the linear amplifier and amplifier stages 124 is the peaking amplifier, and a second configuration where amplifier stages 124 is the linear amplifier and amplifier stages 122 is the peaking amplifier. Termination circuit 132 can include a switch S1, a switch S2, and a resistor R. Switch S1 can be connected in series with resistor R, and switch S2 can be connected in parallel with switch S1 and resistor R. In one embodiment, switches S1 and S2 can be metal-oxide-semiconductor field-effect transistors (MOSFETs).

Controller 102 can be configured to switch switches S1, S2 on or off. Termination circuit 132 can be tuned to one of three conditions: 1) open, 2) short, and 3) matched. Termination circuit 132 is tuned to open condition when controller 102 switches off both switches S1, S2 (e.g., S1, S2 are opened). Termination circuit 132 is tuned to short condition when controller 102 switches on switch S2 (e.g., S2 is short or closed opened). Under the short condition, the state of switch S1 is a don't care condition (e.g., can be on or off). Termination circuit 132 is tuned to matched condition when controller 102 switches on switch S1 and switches off switch S2 (e.g., S1 is closed or short, S2 is opened). Controller 102 can be configured to tune termination circuit to one of the three conditions based on: 1) whether power amplifier chain 120 is operating as Doherty power amplifier or balanced power amplifier, and 2) a phase of the product μα.

In a first scenario, power amplifier chain 120 can operate in the first operation mode to implement a Doherty power amplifier with amplifier stages 122 configured as a peaking amplifier and amplifier stages 124 configured as a linear amplifier. In this first scenario, a phase of the product μα can be either zero or 180 degrees. Under the configurations of amplifier stages 122, 124 in the first scenario, controller 102 can tune termination circuit 132 to short condition by switching on switch S2 and maintaining switch S1 in any state (e.g., don't care state). In the first scenario, since the phase is either zero or 180 degrees and amplifier stages 124 is configured as the main amplifier of the Doherty amplifier, the product μα is a real number and the short condition of termination circuit 132 provides a reflection coefficient $\Gamma_r$ of −1.

In a second scenario, power amplifier chain 120 can operate in the first operation mode to implement a Doherty power amplifier with amplifier stages 122 configured as a linear amplifier and amplifier stages 124 configured as a peaking amplifier. In this second scenario, a phase of the product μα can be ±90 degrees. Under the configurations of amplifier stages 122, 124 in the second scenario, controller 102 can tune termination circuit 132 to short condition by switching on switch S2 and maintaining switch S1 in any state (e.g., don't care state). In the second scenario, since the phase is +90 degrees and amplifier stages 122 is configured as the main amplifier of the Doherty amplifier, the product μα is a real number and the short condition of termination circuit 132 provides a reflection coefficient $\Gamma_r$ of −1.

In a third scenario, power amplifier chain 120 can operate in the first operation mode to implement a Doherty power amplifier with amplifier stages 122 configured as a peaking amplifier and amplifier stages 124 configured as a linear amplifier. In this third scenario, a phase of the product μα can be ±90 degrees. Under the configurations of amplifier stages 122, 124 in the third scenario, controller 102 can tune termination circuit 132 to open condition by switching off both switches S1, S2. In the third scenario, since the phase is +90 degrees and amplifier stages 124 is configured as the main amplifier of the Doherty amplifier, the product μα is an imaginary number and the open condition of termination circuit 132 provides a reflection coefficient $\Gamma_r$ of 1.

In a fourth scenario, power amplifier chain 120 can operate in the first operation mode to implement a Doherty power amplifier with amplifier stages 122 configured as a linear amplifier and amplifier stages 124 configured as a peaking amplifier. In this fourth scenario, a phase of the product μα can be either zero or 180 degrees. Under the configurations of amplifier stages 122, 124 in the fourth scenario, controller 102 can tune termination circuit 132 to open condition by switching off both switches S1, S2. In the fourth scenario, since the phase is either zero or 180 degrees and amplifier stages 122 is configured as the main amplifier of the Doherty amplifier, the product μα is an imaginary number and the open condition of termination circuit 132 provides a reflection coefficient $\Gamma_r$ of 1.

In a fifth scenario, power amplifier chain 120 can operate in the second operation mode to implement a balanced power amplifier with both amplifier stages 122, 124 configured as a linear amplifiers. In this fourth scenario, regardless of a phase of the product μα (e.g., the phase can be zero, +90, or 180 degrees) controller 102 can tune termination circuit 132 to matched condition by switching on switch S1 and switching off switch S2.

Figure 3:
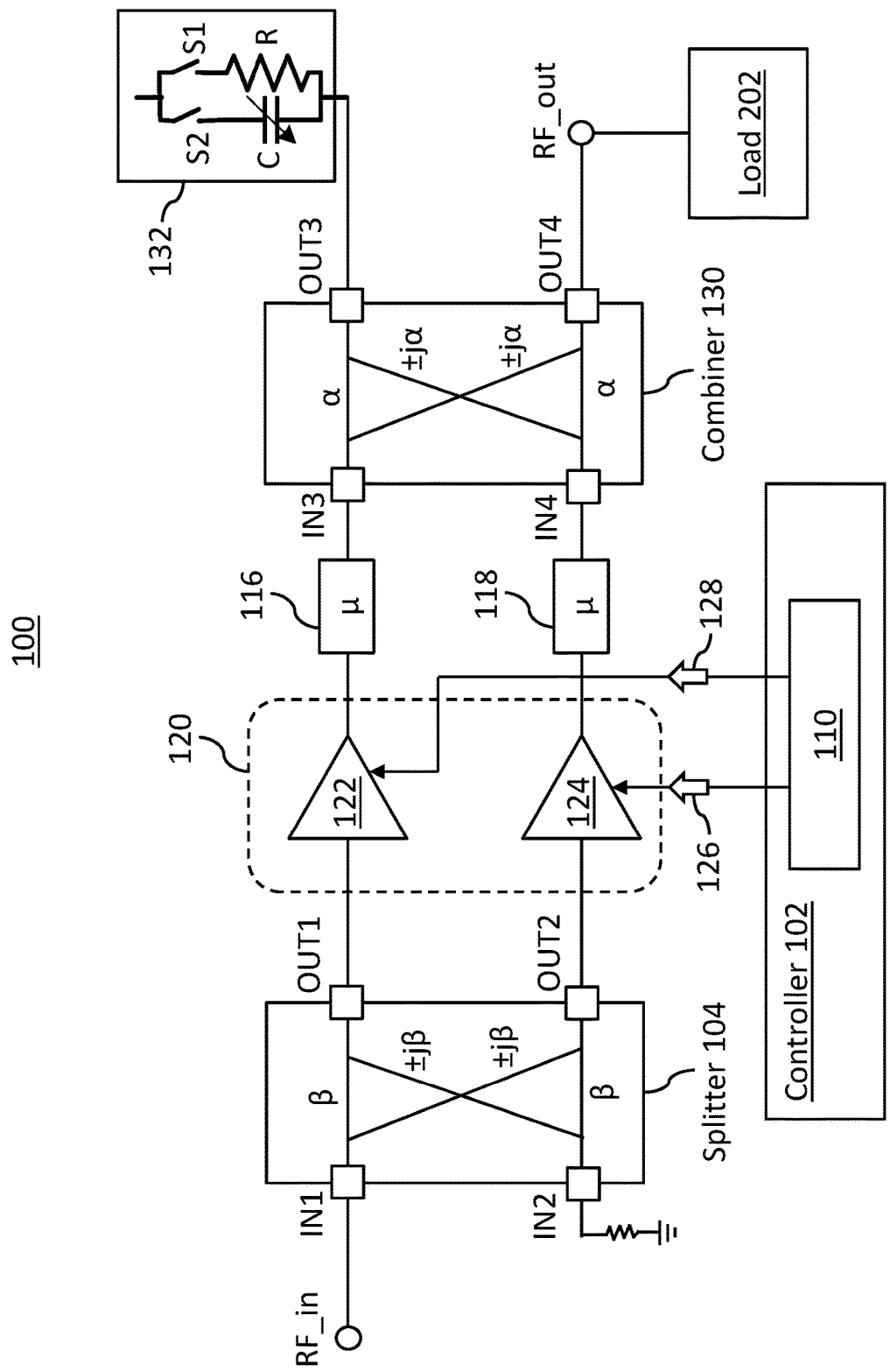
FIG. 3 is a diagram showing other additional details of the example apparatus shown in FIG. 1 in one embodiment.

FIG. 3 is a diagram showing other additional details of the example apparatus shown in FIG. 1 in one embodiment. In an aspect, the phase of product μα can change with frequency (e.g., operating frequency of apparatus 100) due to matching networks and couplers having physical delays. In the embodiment shown in FIG. 3, a tunable capacitor C can be inserted in termination circuit 132 to accommodate the frequency changes. Tunable capacitor C can be connected in series with switch S2, and in parallel with switch S1 and resistor R. Tunable capacitor C can be a varactor or a plurality of capacitors that can be switched into or out of tunable capacitor (e.g., by controller 102) to change a capacitance value of tunable capacitor C.

Controller 102 can refer to a relationship among the operating frequency of apparatus 100, the phase of the product μα, and capacitance value of tunable capacitor C. In an aspect, the phase of the product μα can vary with the operating frequency, and the capacitance value of tunable capacitor C can very inversely with the phase of the product μα and the operating frequency. In one embodiment, the relationship among the operating frequency of apparatus 100, the phase of the product μα, and capacitance value of tunable capacitor C can be mapped to a lookup table and the lookup table can be stored in a memory device of controller 102.

Controller 102 can be configured to monitor the operating frequency of apparatus 100 and use the lookup table to determine a target capacitance value that corresponds to a target phase value. For example, at an operating frequency of 27 gigahertz (GHz), tunable capacitor C having a capacitance of 21.0 femtofarads (fF) that meet the condition $$\Gamma_r = -\frac{1}{2(\mu\alpha)^2}$$

when the phase μα is −80 degrees according to the lookup table. If the lookup table indicates that at an operating frequency of 29 GHz, a phase of μα equal to −88 degrees correspond to a capacitance of 3.5 fF, then controller 102 can tune tunable capacitor C from 21.0 f to 3.5 fF in order to adjust the termination to accommodate phase change of μα from −80 degrees to −88 degrees, thus bringing the termination closer to meeting the condition $$\Gamma_r = -\frac{1}{2(\mu\alpha)^2}.$$

In one embodiment, controller 102 can monitor operating frequency of apparatus 100 and tune tunable capacitor C when power amplifier chain 120 operates in the first operation mode to implement a Doherty amplifier.

Figure 4:
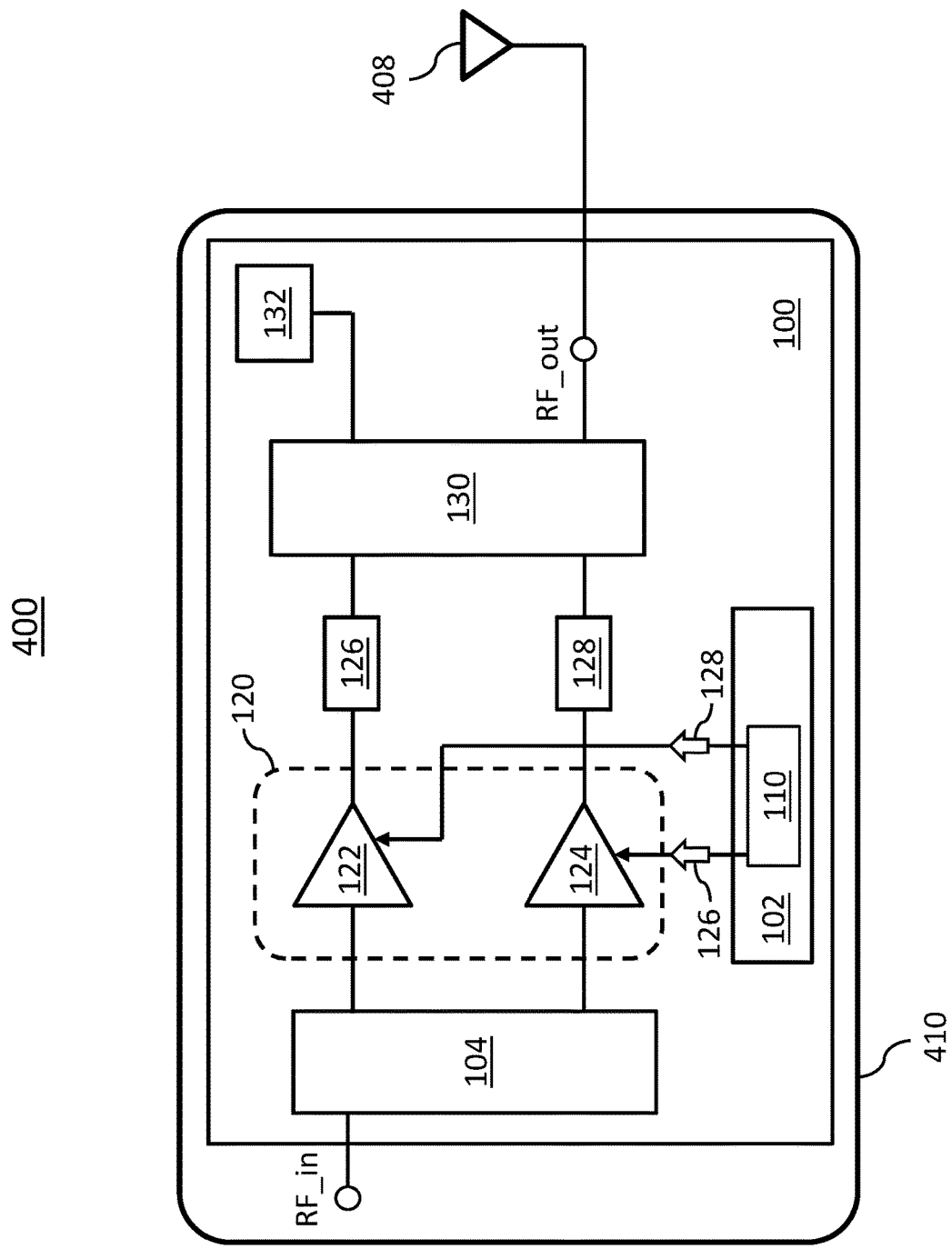
FIG. 4 is a diagram showing an example communication system that can implement reconfigurable and tunable power amplifier in one embodiment.

FIG. 4 is a diagram showing an example communication system that can implement reconfigurable and tunable power amplifier in one embodiment. A system 400 shown in FIG. 4 can be a communication system, such as a beamformer chip for wireless transmission including a radio transmitter or transceiver. System 400 can include a transmitter or a transmission channel 410 that includes apparatus 100, a receiver or a receiver channel 420, and one or more antennas 408. Transmitter 410 can be configured to provide input signal RF_in to apparatus 100. In one embodiment, transmitter 410 can further include a front-end circuit including control components, such as gain control circuits and phase control circuits that may adjust a gain and phase of the input signal RF_in prior to being amplified by apparatus 100. Apparatus 100 can send output signal RF_out to antenna 408.

In an example embodiment, apparatus 100 can be a cellular long-term evolution (LTE) or fifth generation (5G) amplifier and system 400 can be a radio-frequency front-end or beamformer chip in a cellular phone. LTE signals being transmitted by the beamformer chip can have different bandwidth based on operations of the cellular phone. If the LTE signals are narrowband signals, then apparatus 100 can configure power amplifier chain 120 to operate under the first mode to optimize efficiency to preserve battery life of the cellular phone. If the LTE signals are wideband signals, such as when the cellular phone needs to upload relatively large files, apparatus 100 can configure power amplifier chain 120 to operate in the second mode to optimize linearity. Other factors that can trigger apparatus 100 to change operation modes of power amplifier chain 120 can include the power needed to transmit a beam, a direction of the beam scanning angle of beamformer chip, or other factors relating to transmission performed by the beamformer.

FIG. 5 is a flowchart of an example process that may implement reconfigurable and tunable power amplifier in one embodiment. Process 500 in FIG. 5 may be implemented using, for example, apparatus 100 discussed above. An example process may include one or more operations, actions, or functions as illustrated by one or more of blocks 502, 504, and/or 506. Although illustrated as discrete blocks, various blocks may be divided into additional blocks, combined into fewer blocks, eliminated, performed in different order, or performed in parallel, depending on the desired implementation.

In one embodiment, process 500 can be performed by a controller configured to control a power amplifier. Process 500 can begin at block 502. At block 502, the controller can drive a power amplifier chain with first input bias voltages to operate the power amplifier chain in a first operation mode that implements a Doherty amplifier. In one embodiment, the power amplifier chain can include a pair of identical amplifiers. Process 500 can proceed from block 502 to block 504. At block 504, the controller can drive the power amplifier chain with second input bias voltages to operate the power amplifier chain in a second operation mode that implements a balanced amplifier. Process 500 can proceed from block 504 to block 506. At block 506, the controller can tune a termination circuit in accordance with an operation mode of the power amplifier chain.

In one embodiment, in response to the power amplifier chain operating in the first operation mode, the controller can tune the termination circuit to provide a reflective termination to a combiner connected to the power amplifier chain. In one embodiment, in response to the power amplifier chain operating in the first operation mode, the controller can tune the termination circuit based on a phase of a transmission from the power amplifier chain to a combiner connected to the power amplifier chain. In one embodiment, in response to the power amplifier chain operating in the first operation mode, the controller can tune the termination circuit based on an operating frequency of the apparatus. In one embodiment, in response to the power amplifier chain operating in the second operation mode, the controller can tune the termination circuit to provide a matched termination to a combiner connected to the power amplifier chain.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   a termination circuit; and
   a controller configured to:
      drive a power amplifier chain with first input bias voltages to operate the power amplifier chain in a first operation mode that implements a Doherty amplifier;
      drive the power amplifier chain with second input bias voltages to operate the power amplifier chain in a second operation mode that implements a balanced amplifier; and
      tune the termination circuit to a condition among an open condition, a short condition, and a matched condition, wherein the termination circuit is tuned to the condition based on:
         an operation mode of the power amplifier chain; and
         a phase of at least one matching network connected to outputs of the power amplifier chain.

2. The apparatus of claim 1, wherein the power amplifier chain comprises a pair of identical amplifiers.

3. The apparatus of claim 1, wherein the controller is configured to, in response to the power amplifier chain operating in the first operation mode, tune the termination circuit to one of the open condition and the short condition to provide a reflective termination to a combiner connected to the power amplifier chain.

4. The apparatus of claim 1, wherein the controller is configured to, in response to the power amplifier chain operating in the first operation mode, tune the termination circuit based on a phase of a transmission from the power amplifier chain to a combiner connected to the power amplifier chain.

5. The apparatus of claim 1, wherein the controller is configured to, in response to the power amplifier chain operating in the first operation mode, tune the termination circuit based on an operating frequency of the apparatus.

6. The apparatus of claim 1, wherein the controller is configured to, in response to the power amplifier chain operating in the second operation mode, tune the termination circuit to the matched condition to provide a matched termination to a combiner connected to the power amplifier chain.

7. An apparatus comprising:
   a splitter configured to:
      receive an input radio frequency (RF) signal;
      split the input RF signal into a first RF signal and a second RF signal;
   a power amplifier chain configured to receive the first RF signal and the second RF signal from the splitter;
   a combiner configured to combine a first output and a second output of the power amplifier chain to generate an output RF signal;
   a termination circuit;
   a controller configured to:
      drive the power amplifier chain with first input bias voltages to operate the power amplifier chain in a first operation mode that implements a Doherty amplifier;
      drive the power amplifier chain with second input bias voltages to operate the power amplifier chain in a second operation mode that implements a balanced amplifier; and
      tune the termination circuit to a condition among an open condition, a short condition, and a matched condition to provide adjustable termination to the combiner, wherein the termination circuit is tuned to the condition based on:
         an operation mode of the power amplifier chain; and
         a phase of at least one matching network connected to outputs of the power amplifier chain.

8. The apparatus of claim 7, wherein the power amplifier chain comprises a pair of identical amplifiers.

9. The apparatus of claim 7, wherein the controller is configured to, in response to the power amplifier chain operating in the first operation mode, tune the termination circuit to one of the open condition and the short condition to provide a reflective termination to a combiner connected to the power amplifier chain.

10. The apparatus of claim 7, wherein the controller is configured to, in response to the power amplifier chain operating in the first operation mode, tune the termination circuit based on a phase of a transmission from the power amplifier chain to the combiner.

11. The apparatus of claim 7, wherein the controller is configured to, in response to the power amplifier chain operating in the first operation mode, tune the termination circuit based on an operating frequency of the apparatus.

12. The apparatus of claim 7, wherein the controller is configured to, in response to the power amplifier chain operating in the second operation mode, tune the termination circuit to the matched condition to provide a matched termination to a combiner connected to the power amplifier chain.

13. The apparatus of claim 7, wherein:
   the splitter is a first 90-degree 3-decibel (dB) coupler; and
   the combiner is a second 90-degree 3-dB coupler.

14. The apparatus of claim 13, wherein:
   the termination circuit is connected to a first output port of the second 90-degree 3-dB coupler; and
   a load is connected to a second output port of the second 90-degree 3-dB coupler, wherein the load is driven by the output RF signal.

15. A method for operating a power amplifier, the method comprising:
   driving a power amplifier chain with first input bias voltages to operate the power amplifier chain in a first operation mode that implements a Doherty amplifier;
   driving the power amplifier chain with second input bias voltages to operate the power amplifier chain in a second operation mode that implements a balanced amplifier; and
   tuning a termination circuit to a condition among an open condition, a short condition, and a matched condition, wherein the termination circuit is tuned to the condition based on:
      an operation mode of the power amplifier chain; and a phase of at least one matching network connected to outputs of the power amplifier chain.

16. The method of claim 15, wherein the power amplifier chain comprises a pair of identical amplifiers.

17. The method of claim 15, further comprising, in response to the power amplifier chain operating in the first operation mode, tuning the termination circuit to one of the open condition and the short condition to provide a reflective termination to a combiner connected to the power amplifier chain.

18. The method of claim 15, further comprising, in response to the power amplifier chain operating in the first operation mode, tuning the termination circuit based on a phase of a transmission from the power amplifier chain to a combiner connected to the power amplifier chain.

19. The method of claim 15, further comprising, in response to the power amplifier chain operating in the first operation mode, tuning the termination circuit based on an operating frequency of a device including the power amplifier chain.

20. The method of claim 15, further comprising, in response to the power amplifier chain operating in the second operation mode, tuning the termination circuit to the matched condition to provide a matched termination to a combiner connected to the power amplifier chain.

* * * * *